(12) United States Patent
Qu

(10) Patent No.: US 7,268,395 B2
(45) Date of Patent: Sep. 11, 2007

(54) DEEP TRENCH SUPER SWITCH DEVICE

(75) Inventor: Zhijun Qu, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 89 days.

(21) Appl. No.: 11/141,865

(22) Filed: Jun. 1, 2005

(65) Prior Publication Data
US 2005/0275016 A1    Dec. 15, 2005

Related U.S. Application Data

(60) Provisional application No. 60/577,017, filed on Jun. 4, 2004.

(51) Int. Cl.
*H01L 26/76*   (2006.01)
*H01L 29/94*   (2006.01)
*H01L 31/062*  (2006.01)
*H01L 31/113*  (2006.01)
*H01L 31/119*  (2006.01)

(52) U.S. Cl. .................. 257/342; 257/330; 257/331
(58) Field of Classification Search ......... 257/327–346
See application file for complete search history.

(56) References Cited

U.S. PATENT DOCUMENTS

| | | | |
|---|---|---|---|
| 5,321,298 A | 6/1994 | Moslehi | 257/506 |
| 5,430,315 A | 7/1995 | Rumennik | 257/331 |
| 6,291,298 B1 | 9/2001 | Williams et al. | 438/270 |
| 6,320,222 B1 | 11/2001 | Forbes et al. | 257/331 |
| 6,414,347 B1 | 7/2002 | Divakaruni et al. | 257/296 |
| 6,440,793 B1 | 8/2002 | Divakaruni et al. | 438/243 |
| 6,509,220 B2 | 1/2003 | Disney | 438/197 |
| 6,512,268 B1 | 1/2003 | Ueno | 257/341 |
| 6,518,145 B1 | 2/2003 | Alsmeier et al. | 438/425 |
| 6,518,616 B2 | 2/2003 | Dryer et al. | 257/301 |
| 6,518,739 B2 | 2/2003 | Wald et al. | 323/351 |
| 6,593,619 B1 | 7/2003 | Blanchard | 257/328 |
| 6,605,838 B1 | 8/2003 | Mandelman et al. | 257/305 |
| 6,621,122 B2 | 9/2003 | Qu | 257/339 |
| 6,635,526 B1 | 10/2003 | Malik et al. | 438/243 |
| 6,677,641 B2 | 1/2004 | Kocon | 257/329 |
| 6,730,606 B1 | 5/2004 | Azam et al. | 438/700 |
| 6,750,105 B2 | 6/2004 | Disney | 438/270 |
| 6,750,507 B2 | 6/2004 | Williams et al. | 257/328 |
| 6,750,524 B2 | 6/2004 | Pathasarthy et al. | 257/492 |
| 6,756,274 B2 | 6/2004 | Williams et al. | 438/270 |
| 6,768,170 B2 | 7/2004 | Zhou | 257/341 |
| 6,768,171 B2 | 7/2004 | Disney | 257/342 |
| 6,784,505 B2 | 8/2004 | Zeng | 257/397 |
| 6,787,847 B2 | 9/2004 | Disney | 257/328 |
| 6,787,872 B2 | 9/2004 | Kinzer et al. | 257/492 |
| 6,798,020 B2 | 9/2004 | Disney et al. | 257/342 |
| 6,815,293 B2 | 11/2004 | Disney et al. | 438/268 |
| 6,818,513 B2 | 11/2004 | Marchant | 438/270 |
| 6,822,427 B2 | 11/2004 | Wittenbreder | 323/282 |
| 6,825,078 B1 | 11/2004 | Huang | 438/242 |
| 6,838,722 B2 | 1/2005 | Bhalla et al. | 257/301 |
| 6,855,985 B2 | 2/2005 | Williams et al. | 257/338 |
| 6,858,471 B1 | 2/2005 | Korec et al. | 438/113 |
| 2003/0073287 A1* | 4/2003 | Kocon | 257/330 |

* cited by examiner

*Primary Examiner*—Cuong Nguyen
(74) *Attorney, Agent, or Firm*—Ostrolenk, Faber, Gerb & Soffen, LLP

(57) ABSTRACT

A deep trench super switch device has a plurality of trenches, each of the trenches containing a gate electrode polysilicon layer on top of a plurality of stacked conductive floating polysilicon layers, the remainder of each of the trenches being filled with a nonconductive material.

8 Claims, 1 Drawing Sheet

DEEP TRENCH SUPER SWITCH DEVICE

CROSS-REFERENCE TO RELATED APPLICATION

This application claims the benefit of U.S. Provisional Application No. 60/577,017, filed on Jun. 4, 2004, the entirety of the contents of which is hereby incorporated by reference herein.

BACKGROUND OF THE INVENTION

1. Field of the Invention

This invention relates to semiconductor devices and processes for their manufacture, and more specifically relates to a trench type MOSFET with reduced $R_{DSON}$ and improved reverse recovery characteristics.

2. Description of the Related Art

High voltage superjunction MOSFET devices are well known. Such devices are usually made by a process in which multiple epitaxially grown layers with respective aligned P diffusions (for an N channel device) are formed to define spaced, elongated P type pylons or columns in an N type epitaxially grown substrate (N epi). These P type pylons are in charge balance with the surrounding N epi and, as a result, the concentration of the N epi can be increased, as compared to that of a conventional MOSFET, to reduce on resistance ($R_{DSON}$).

This process is complex and requires a large inventory of epitaxial reactors and a large number of process steps. Further, the breakdown voltage of the superjunction device is very sensitive to the charge balance. Thus, a 10% deviation from an optimum design can defeat production of acceptable devices.

It would be very desirable to provide a device which can be made by a simpler process which has the benefits of the superjunction device but without the need for multiple epitaxial depositions and charge balance control.

SUMMARY OF THE INVENTION

In accordance with the invention, the P type pylons of the superjunction device are replaced by respective stacks of conductive polysilicon bodies separated by thin oxide, thereby to define capacitor stacks within the full depth of the trench. This will define an at least constant electric field along the trench depth from the top to the bottom of the epi layer (N type for an N channel device or P type for a P channel device). The doping concentration of the epi layer can be chosen to be as low as that of a corresponding superjunction device to achieve a low $R_{DSON}$, high voltage MOSFET. Further, since the P column or pylon is not used, the JFET effect of the superjunctions is eliminated along with the charge balance problems.

Further, the body diode is similar to that of the conventional trench device so the reverse recovery property of the new device will be better than that of the superjunction device, particularly beneficial to a zero voltage switch (ZVS) topology application.

DETAILED DESCRIPTION OF THE INVENTION

Figure 1:
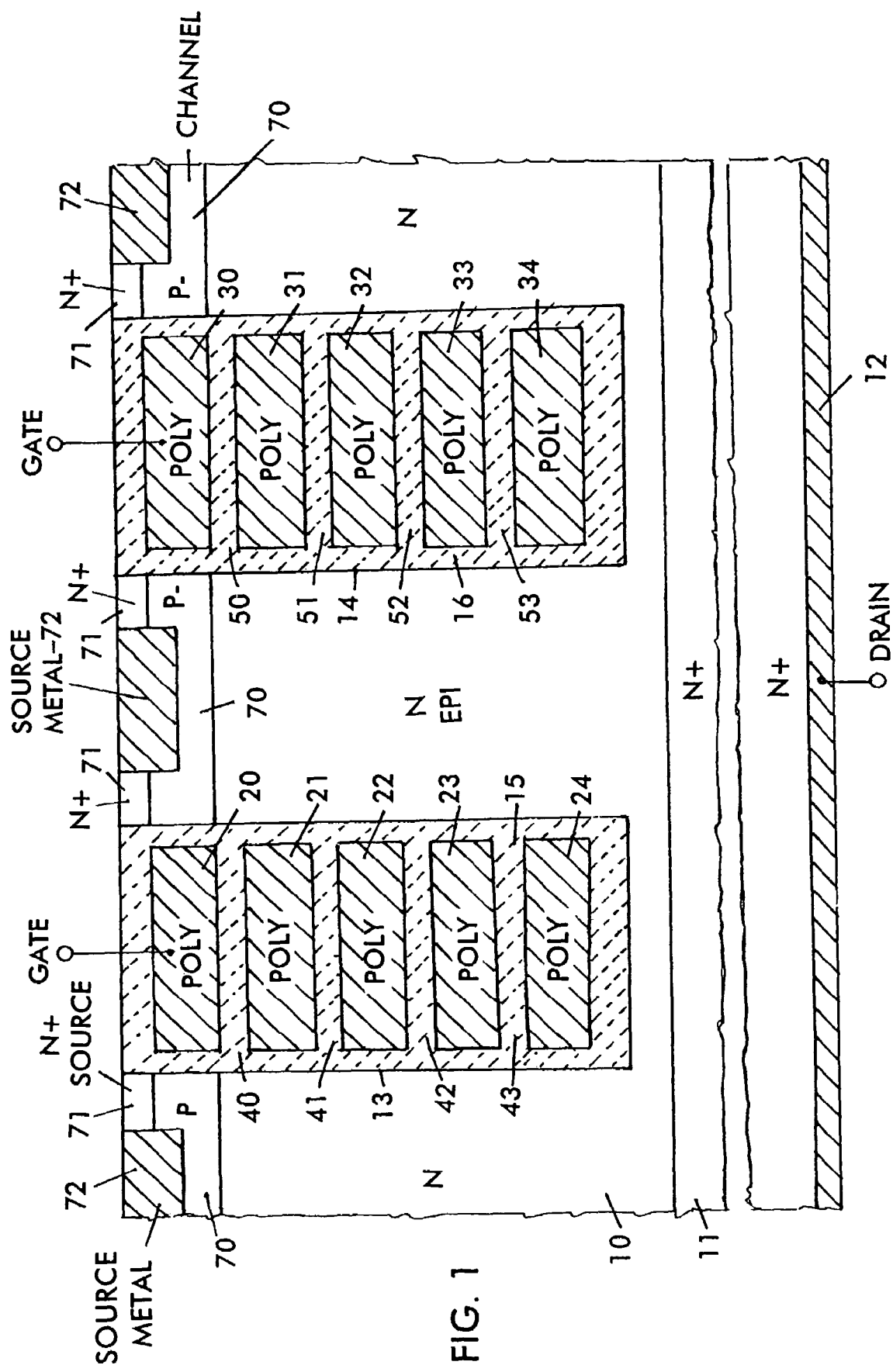
FIG. 1 is a cross-section through a small segment of a wafer (or die) of the present invention.

FIG. 1 shows a small portion of the active area of a 600 volt N channel MOSFET made in accordance with the present invention. Other voltage ratings can be chosen, and the invention can be carried out as a P channel device.

In FIG. 1, an N epi drift layer 10, about 50 μm thick, is grown on an N+ body 11. A drain electrode 12 is formed on the bottom of body 11. Plural parallel trenches are etched into the N epi 10, two of which are shown as trenches 13 and 14. Trenches 13 and 14 may be about 36 μm deep.

The interior and bottom of trenches 13 and 14 are covered with a $SiO_2$ or other insulator material 15 and 16 respectively and are filled by stacks of conductive polysilicon layers 20, 21, 22, 23 and 24 in trench 13 and polysilicon layers 30, 31, 32, 33 and 34 in trench 14. Layers 20 to 24 and 30 to 34 may have any desired thickness, and any number can be used. The spacing between trenches and the width of the trenches can be selected as desired. Each of the polysilicon layers are separated and insulated from one another by thin oxide layers 40, 41, 42 and 43 in trench 13 and 50, 51, 52 and 53 in trench 14. Oxide layers 40-43 and 50-53 (preferably $SiO_2$) are each about 2 μm thick.

A standard trench MOSFET is then formed at the top of the die, including a P channel region 70, an N+ source region 71 and a source metal 72 which contacts the source and channel regions 71 and 70 respectively. Source, gate and drain terminals are formed as shown. It should be noted that the gate terminals are formed in polysilicon layers 20 and 30, and, thus these layers are biased to the gate voltage.

In FIG. 1, the polysilicon stacks 21 to 24 and 31 to 34 are floating and act as a series of capacitors which divide the drain voltage uniformly along the depth of the epi 10. Hence the electric field is relatively constant from top to bottom of the epi layer 10. The trenches may extend for the full depth of epi layer 10. A bottom epi layer can be left as shown as an option for a higher voltage device.

The doping concentration of epi layer 10 can be made as low as in a superjunction device to achieve a low $R_{DSON}$, high voltage MOSFET.

Since the novel structure of the invention does not have the P column (for an N channel device) the "super" JFET effect is eliminated. Further, the body diode is similar to that of a conventional trench device so its reverse recovery property will be significantly improved from classical superjunction devices to make it perform better, especially in ZVS (zero voltage switch) technology.

Although the present invention has been described in relation to particular embodiments thereof, many other variations and modifications and other uses will become apparent to those skilled in the art such as fill the trench with P/N diode instead of polysilicon. It is preferred, therefore, that the present invention be limited not by the specific disclosure herein.

What is claimed is:

1. A deep trench super switch device comprising:
   a drain electrode;
   a body formed on the drain electrode of a first conductivity type;
   an epitaxial layer of a first conductivity type formed on the body of the first conductivity type;
   a plurality of trenches etched into the epitaxial layer, each of the plurality of trenches containing a stack of conductive floating polysilicon layers, a gate electrode on top of the stack of conductive floating polysilicon layers, and a nonconductive material surrounding each of the gate electrode and the conductive polysilicon layers;

a plurality of channel regions of a second conductivity type, each of the channel regions being formed on the epitaxial layer and between two opposing trenches and opposite a respective gate electrode in each of said opposing trenches;

a plurality of source regions of the first conductivity type, each of the source regions being formed in one of the channel regions; and a plurality of source contacts, each of the source contacts contacting one of the source regions and one of the channel regions.

2. The deep trench super switch device of claim 1, wherein the plurality of trenches are arranged parallel to one another.

3. The deep trench super switch device of claim 1, wherein the plurality of trenches extend for the entire depth of the epitaxial layer.

4. The deep trench super switch device of claim 1, wherein the nonconductive material is silicon dioxide.

5. The deep trench super switch device of claim 1, wherein the plurality of trenches do not extend for the entire depth of the epitaxial layer.

6. The deep trench super switch device of claim 1, wherein the gate electrode is a conductive polysilicon layer.

7. The deep trench super switch device of claim 1, wherein the stack of conductive floating polysilicon layers and the gate electrode have the same cross sectional area.

8. The deep trench super switch device of claim 1, wherein adjacent trenches have corresponding gate electrodes which are biased to a gate voltage.

* * * * *